(12) United States Patent
Forehand

(10) Patent No.: US 7,498,911 B2
(45) Date of Patent: Mar. 3, 2009

(54) MEMBRANE SWITCH COMPONENTS AND DESIGNS

(75) Inventor: David Forehand, Plano, TX (US)

(73) Assignee: Memtronics Corporation, Plano, TX (US)

( * ) Notice: Subject to any disclaimer, the term of this patent is extended or adjusted under 35 U.S.C. 154(b) by 0 days.

(21) Appl. No.: 10/785,205

(22) Filed: Feb. 24, 2004

(65) Prior Publication Data

US 2005/0077987 A1  Apr. 14, 2005

Related U.S. Application Data

(60) Provisional application No. 60/450,637, filed on Feb. 26, 2003.

(51) Int. Cl.
*H01H 51/22* (2006.01)
(52) U.S. Cl. .......................... 335/78; 200/181
(58) Field of Classification Search ............ 335/78; 200/181
See application file for complete search history.

(56) References Cited

U.S. PATENT DOCUMENTS

| | | | | |
|---|---|---|---|---|
| 5,638,946 A | * | 6/1997 | Zavracky | 200/181 |
| 6,384,353 B1 | * | 5/2002 | Huang et al. | 200/181 |
| 6,529,093 B2 | * | 3/2003 | Ma | 333/101 |
| 6,633,212 B1 | * | 10/2003 | Ruan et al. | 335/78 |
| 6,646,215 B1 | * | 11/2003 | Nelson | 200/181 |
| 6,668,667 B2 | * | 12/2003 | Seliger | 73/862.391 |
| 6,876,482 B2 | * | 4/2005 | DeReus | 359/290 |
| 6,949,985 B2 | * | 9/2005 | Qiu et al. | 333/105 |
| 2005/0099252 A1 | * | 5/2005 | Isobe et al. | 335/78 |
| 2007/0146095 A1 | * | 6/2007 | Chou et al. | 333/105 |

* cited by examiner

*Primary Examiner*—Elvin G Enad
*Assistant Examiner*—Bernard Rojas
(74) *Attorney, Agent, or Firm*—Carr LLP

(57) ABSTRACT

The present invention provides a method and apparatus for reducing temperature dependency within Microelectromechanical System (MEMS) switches. The two typical designs for such MEMS switches are fixed-fixed and fixed-free designs. Springs are used in the fixed-fixed design to account for dimensional changes as a result of thermal expansion. The fixed-free designs utilize a tether to prevent a cantilever arm from deforming as a result of thermal expansions, as well as reducing tight controls in the manufacture of fixed-free MEMS switches. Additionally, to prevent stiction in MEMS switches, a variegated electrode design is provided to utilize internal stresses of a suspended beam to increase the restoring force while not increasing the actuation force.

17 Claims, 2 Drawing Sheets

MEMBRANE SWITCH COMPONENTS AND DESIGNS

CLAIM OF PRIORITY

This application claims priority from U.S. Provisional Patent Application No. 60/450,637 entitled "MEMBRANE SWITCH COMPONENTS AND DESIGNS" by David Forehand, filed on Feb. 26, 2003, which provisional patent application that is hereby incorporated by reference.

FIELD OF THE INVENTION

The present invention relates generally to electromechanical switch design and, more particularly, to modifications of current Microelectromechanical System (MEMS) switches to overcome temperature dependency and stiction.

DESCRIPTION OF THE RELATED ART

MEMS may be used in Radio Frequency (RF) switches, phase arrays, phase scanning, compensating circuits, filters, switch matrices, channel switching, and the like. The unique characteristics of these devices, including their superior performance, reduced size, and low potential cost, can allow them to become an enabling technology for a variety of military and commercial applications. However, there are two typical phenomenon that plague micromechanical structures: temperature dependency and stiction.

The first problem is related to temperature dependent performance. For example, with an RF MEMS switch the membrane should be electrically conductive while the substrate should be an electrical insulator. The thermal properties of the membrane and substrate are significantly different and results in substantially different coefficients of thermal expansion (CTE). This resulting CTE mismatch is approximately 15 to 20 PPM/° C. for an RF MEMS switch.

Currently, there are two common beam designs, utilizing either a free-fixed beam or a fixed-fixed beam, each with distinct advantages and drawbacks.

The first beam design utilizes a free-fixed mechanical beam, also known as a cantilever. The force required to pull down a single layer cantilever is inherently temperature independent because the membrane's stress does not change since one end is free to move during temperature changes. However, the cantilever design suffers from several phenomenon pertaining to repeatability and manufacturability. For an electrostatically actuated switch, the pull-in voltage ($V_p$) is dependent on the gap, which is the distance between the movable membrane and the electrode. For a cantilever design, any stress gradient within the membrane will cause it to curl, thus changing the gap and $V_p$. Therefore, process control requirements are such that stress gradients need to be extremely tightly controlled. Small process deviations can result in variations in Vp. If these variations are sufficiently large, the device will not operate properly and result in significant yield loss.

The second beam design utilizes a fixed-fixed mechanical beam attached at both ends of the suspended mechanical beam to the substrate. The mechanical beam and the substrate typically have different CTEs. When the temperature changes, the substrate expands or contracts much less than the mechanical beam according to their respective CTEs. Since the substrate is approximately one thousand times thicker than the mechanical beam, the temperature change causes the stress within the mechanical beam to change which, in turn, changes the spring constant of the mechanical beam. Thus, the force required to pull down the mechanical beam will change with temperature. For example, the $V_p$ of an electrostatically actuated RF MEMS switch with a fixed-fixed aluminum membrane on a silicon substrate will change 0.35-0.6 V/° C. However, system specifications require the $V_p$ to change less than 0.1 V/° C.

A second problem that MEMS encounter is stiction, in which the moveable mechanical beam does not release from the electrode, or substrate, when intended. Stiction can be caused for numerous reasons, such as charge build-up in a dielectric, micro-welding of ohmic contacts, contamination, water absorption, and so forth. The restoring force, $F_r$, of the mechanical beam needs to be greater than the stiction forces in order for the moveable mechanical beam to pull away from the electrode/substrate. However, to date, switch designs suffer from having the pull-in force coupled with the $F_r$. For an RF MEMS switch, increasing the $F_r$ typically increases the pull-in voltage. This would increase the electric field across the dielectric which is known to increase the dielectric charging, which increases the charging related stiction, thereby canceling the beneficial increase in $F_r$.

Therefore, there is a need for modified MEMS switch designs that address at least some of the problems associated with conventional MEMS switches.

SUMMARY OF THE INVENTION

The present invention provides a cantilever MEMS switch. The cantilever MEMS switch comprising a tether with two ends. A first end of the tether is coupled to a substrate, and a second end of the tether is coupled to the a cantilever arm.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electromagnetic signaling techniques, and the like, have been omitted inasmuch as such details are not considered necessary to obtain a complete understanding of the present invention, and are considered to be within the understanding of persons of ordinary skill in the relevant art.

Figure 1:
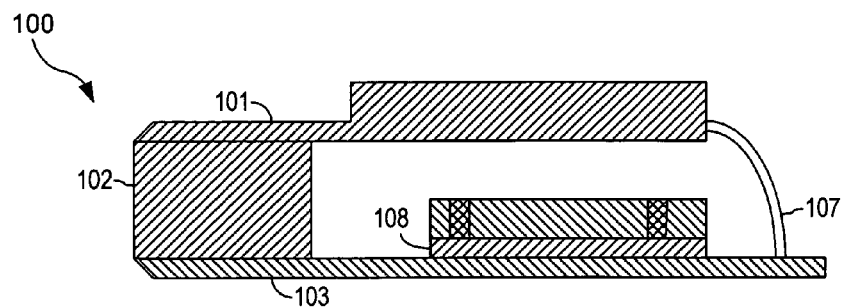
FIG. 1 is a drawing depicting a modified fixed-free beam (cantilever) with a gap-controlling tether.

Referring to FIG. 1 of the drawings, the reference numeral 100 generally designates a drawing depicting an modified fixed-free micromechanical beam.

A solution to the cantilever CTE mismatch phenomenon and extremely tight process control requirements is to use a tethered cantilever design 100. The tethered cantilever 100 attaches highly compliant (low spring constant) tethers 107 to the free-end of the cantilever approximately perpendicular to the main cantilever beam. The tethers are sized to hold down a beam with a vertical stress gradient at a fixed gap but yet be sufficiently compliant to absorb any CTE mismatch by flexing sideways.

There are several advantages to the tethered cantilever 100. The gap can be controlled by the tether length which makes the gap insensitive to vertical stress gradients thereby maintaining a constant $V_p$. Also, the restoring force can be increased by purposely increasing the stress gradient without increasing the gap, thereby decoupling pull-in voltage from restoring force. Additionally, process controls can be reduced because of a reduced sensitivity to variation in beam stress. A high restoring force is also desirable to potentially alleviate stiction. In addition to having no CTE mismatches, the tethered cantilever design 100 could result in higher production yield and allow for more robust micromechanical beams by decoupling actuation force from restoring force.

The modified fixed-free micromechanical beam (cantilever) 100 comprises a suspended beam 101, a mechanical anchor 102, a substrate 103, a control electrode 108, and a tether 107. The suspended beam 101 is connected on one end to the mechanical post 102, which rests upon the substrate 103. A control electrode 108 also rests upon the substrate 103, and is utilized to modify the position of the suspended beam 101. In the case of an electrostatically operated RF switch, an applied voltage is applied to control electrode 108 to move the suspended beam 101 into an alternative position or state. Accordingly, there is also a tether 107 attached between the substrate 103 and the suspended beam 101.

The tether 107 is a new feature that improves upon the traditional fixed-free cantilevered beam. One typical problem with the traditional fixed-free beam is that the suspended beam 101 has a tendency to curl up both during operation and/or during manufacture. Hence, the life of a traditional fix-free beam can be limited, and the manufacturing process requires tight controls. However, the tether 107 prevents the suspended beam 101 from curling up. Moreover, the tether 107 can provide a gap limit for the beam. There can be multiple tethers or a single tether, as depicted in FIG. 1, of a variety of shapes, sizes, and lengths. Moreover, the tether or tethers can be attached to both the substrate and the suspended beam in a variety of locations that include, but are not limited to, the front and sides of the cantilevered beam.

Figure 2A:
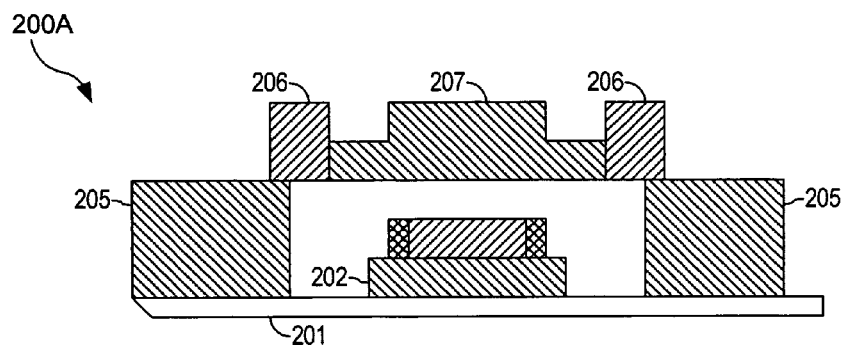
FIG. 2a is a drawing depicting the side view of a modified fixed-fixed micromechanical beam such that changes in temperature are not translated into changes in actuation voltage.
Figure 2B:
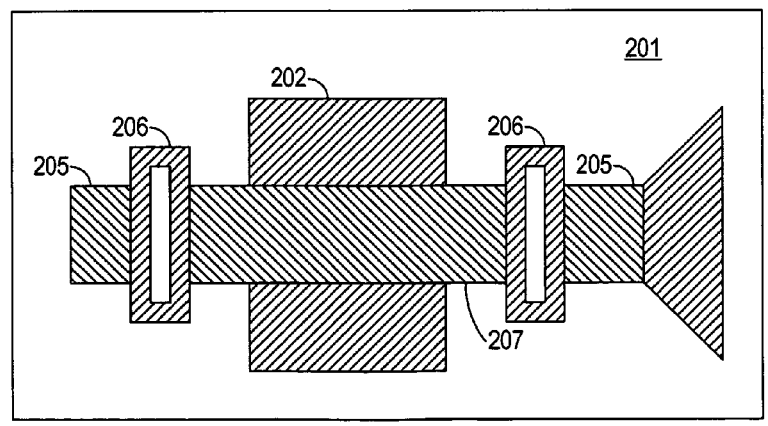
FIG. 2b is a drawing depicting the top view of a modified fixed-fixed micromechanical beam such that changes in temperature are not translated into changes in actuation voltage.

Referring to FIGS. 2a and 2b of the drawings, the reference numerals 200a and 200b generally designate modified fixed-fixed beam microstructures.

The modified fixed-fixed micromechanical structure 200 comprises a suspended beam 207, mechanical anchors 205, a substrate 201, a control electrode 202, and auxiliary beam springs 206. The mechanical anchors 205 and the control electrode 202 rest on the substrate 201. The suspended beam 207 is attached to the beam springs 206, which flex and attempt to make contact with the control electrode when the beam is engaged. The beam springs 206 rest on and are attached to the mechanical anchors 205. The beam springs 206 are treated in detail below.

The beam springs 206 are a new feature that improves upon the traditional fixed-fixed micromechanical beam. The typical problem with the traditional fixed-fixed beams is that the suspended beam 207 undergoes thermal expansion/contraction as a result of changes in temperature. Since, each end of the suspended beam 207 is fixed into position by an anchor 205, changes in temperature result in a change in stress of the beam. Hence, to alleviate the phenomenon that result from thermal expansion/contraction of the substrate 201 relative to the beam 207, the beam springs 206 flex to absorb the dimensional changes of the suspended beam. Thus, the variation in beam stress is diminished. With the beam springs 206, the spring constant can be varied in a number of manners. For example, the beam spring 206 can be lengthened or widened. Hence, in designing a fixed-fixed micromechanical beam for a desired use, a designer has an increase in the degrees of freedom to eliminate stress changes that result from thermal expansion.

Standard fixed-fixed beams have three degrees of freedom (DoF): length, width, and length. The temperature independent fixed-fixed (TIFF) beam design 200, though, incorporates three to five additional DoFs: arm length, arm width, arm thickness, gap between arms, and number of arms. This allows the TIFF design 200 to achieve CTE mismatch compensation to <0.1 V/° C., while maintaining desired actuation voltage. Therefore, the fixed-fixed beam CTE mismatch problem is effectively solved using a TIFF beam design 200.

Figure 3:
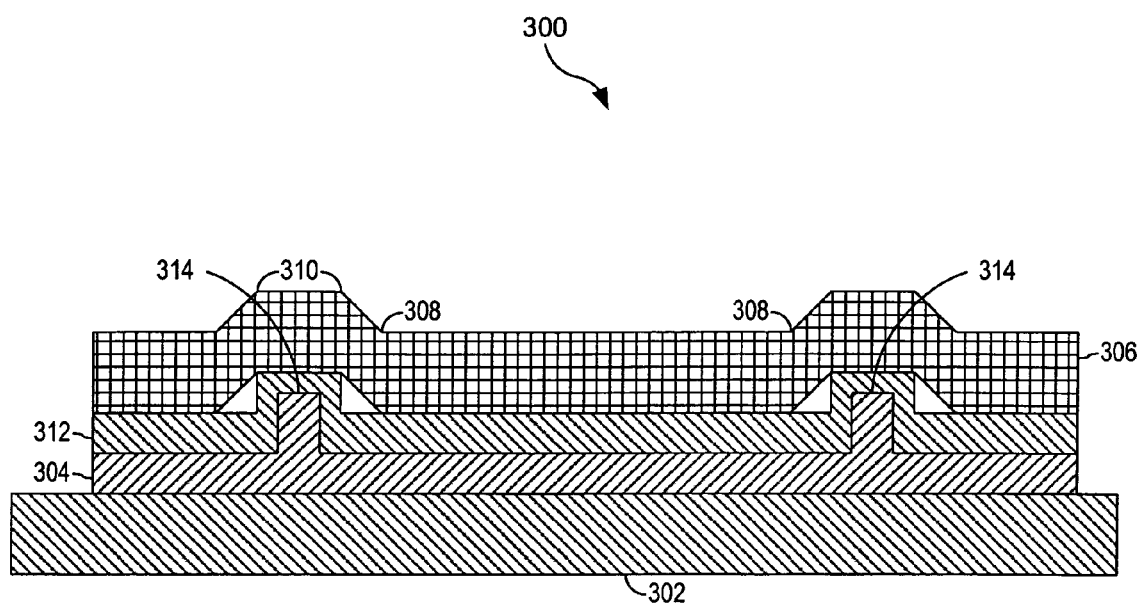
FIG. 3 is a drawing depicting a variegated electrode structure which mitigates stiction issues associated with micromechanical beams.

Referring to FIG. 3 of the drawings, the reference numeral 300 generally designates a drawing depicting a micromechanical beam with a variegated control electrode. The variegated electrode 100 comprises a substrate 302, an electrode 304, a dielectric material 312, and a movable beam 306. In FIG. 3, the moveable beam 306 is depicted in the down position. As the beam 306 contacts the dielectic 312, the beam 306 deforms over the bumps 314. The bumps 314 are small features that are placed in the stationary electrode 304.

The entire moveable beam 306 is stretched slightly as it pulls down around the bumps 314. As the beam rests over the dielectric 312, strain within the beam 306 increases. Points of compression 308 and point of tension 310 are created. For example, if the bumps are 1000 angstroms high and 100 microns apart, then the beam's strain would increase (stretches) by approximately $0.2/100=0.002$.

Assuming the beam is aluminum, which has Young's modulus of 70 GPa, then the 0.002 strain increase would equate to an increase in tensile stress of approximately 140 MPa. The increase in beam stress around the bumps 314 will be even larger. Due to the presence of the bumps 314, the beam 306 release characteristics will be enhanced because the beam will first start to pull up around the electrode features, thereby quickly decreasing contact area and the resulting stiction forces. Increasing the beam tensile stress and improving the beam release characteristics in this manner will increase the restoring force but will not affect the pull-in voltage, thereby decoupling one from the other.

It will further be understood from the foregoing description that various modifications and changes may be made in the preferred embodiment of the present invention without departing from its true spirit. This description is intended for purposes of illustration only and should not be construed in a limiting sense. The scope of this invention should be limited only by the language of the following claims.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifi- cations may be considered desirable by those skilled in the art based upon a review of the foregoing description of preferred embodiments. Accordingly, it is appropriate that the appended claims be construed broadly and in a manner consistent with the scope of the invention.

The invention claimed is:

1. An apparatus, wherein the apparatus is a temperature-independent microscopic switch, comprising:
    a substrate, wherein the substrate is at least configured to support the switch;
    a conductive beam, wherein the conductive beam is at least configured to be suspended from an anchor with one free end;
    means for engaging, wherein the means for engaging at least engages the conductive beam to allow signal transmission; and
    at least one tether, wherein the at least one tether is at least configured to be attached to a fixed location and attached to the conductive beam away from the anchor.

2. The apparatus of claim 1, wherein the apparatus further comprises means for insulation, wherein the means for insulation at least provides a non-conductive barrier between the conductive beam and at least one electrode when the microscopic switch is engaged.

3. The apparatus of claim 2, wherein the means for insulation further comprise air.

4. The apparatus of claim 2, wherein the means for insulation further comprise Silicon Oxide ($SiO_2$).

5. The apparatus of claim 2, wherein the means for insulation further comprise Silicon Nitride ($Si_3N_4$).

6. The apparatus of claim 1, wherein the apparatus further comprises an ohmic contact at least during a portion of when the microscopic switch is engaged.

7. The apparatus of claim 1, wherein the anchor comprises a mechanical post coupled to a proximal end of the conductive beam and coupled to the substrate, the proximal end being opposite the free end of the conductive beam, whereby, the mechanical post anchors the conductive beam.

8. A MEMS device comprising
    a cantilever arm for completing an electrical path to at least a conducting surface, the cantilever arm having a portion attached to a substrate and a movable portion, which is suspended over the conducting surface;
    a tether having at least two ends, wherein a first end of the tether is at least coupled to a fixed location on the MEM device, and wherein a second end of the tether is at least coupled to the movable portion of the cantilever arm; and
    wherein the substrate is configured to be non-conductive.

9. The MEMS device of claim 8, wherein the device further comprises means for insulation, wherein the means for insulation at least provides a non-conductive barrier when the MEMS device is engaged.

10. The MEMS of claim 9, wherein the means for insulation further comprises air.

11. The MEMS device of claim 9, wherein the means for insulation further comprises Silicon Oxide ($SiO_2$).

12. The MEMS device of claim 9, wherein the means for insulation further comprises Silicon Nitride ($Si_3N_4$).

13. The MEMS device of claim 8 wherein the MEMS device further comprises an ohmic contact at least during a portion of when the MEMS device is engaged.

14. A method of operation of a temperature-independent microscopic switch, comprising:
    moving a suspended beam portion of a fixed-free micromechanical beam used to complete an electrical path with an actuating force applied along the suspended beam portion; and
    limiting movement of the suspended beam portion of the fixed-free micromechanical beam with a tether attached to the fixed-free micromechanical beam at a point different than an attachment point for an anchor.

15. The method of claim 14, wherein limiting movement of the suspended beam portion of the fixed-free micromechanical beam comprises limiting movement of a cantilevered beam.

16. The method of claim 14, wherein limiting movement of the suspended beam portion comprises limiting curling movement of the fixed-free micromechanical beam.

17. The method of claim 14, the method further comprising the tether providing a gap limit for the fixed-free micromechanical beam.

* * * * *